(12) United States Patent
Lin et al.

(10) Patent No.: US 6,780,524 B2
(45) Date of Patent: Aug. 24, 2004

(54) IN-SITU OXIDIZED FILMS FOR USE AS GAP LAYERS FOR A SPIN-VALVE SENSOR AND METHODS OF MANUFACTURE

(75) Inventors: Tsann Lin, Saratoga, CA (US); Daniele Mauri, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 10/066,835

(22) Filed: Feb. 4, 2002

(65) Prior Publication Data

US 2003/0031894 A1 Feb. 13, 2003

Related U.S. Application Data

(63) Continuation-in-part of application No. 09/919,280, filed on Jul. 31, 2001.

(51) Int. Cl.[7] ............................................. G11B 5/127
(52) U.S. Cl. ................. 428/611; 428/623; 428/632; 428/640; 428/675; 428/676; 428/678; 428/679; 428/215; 428/336; 428/692; 428/702; 360/324; 360/324.2; 360/120; 360/121
(58) Field of Search .................... 428/640, 611, 428/621, 623, 632, 633, 637, 638, 669, 675, 676, 678, 679, 215, 336, 692, 702; 360/324.1, 324.11, 324.12, 324.2, 119, 120, 121

(56) References Cited

U.S. PATENT DOCUMENTS

| | | | |
|---|---|---|---|
| 4,825,325 A | 4/1989 | Howard | 360/113 |
| 5,014,147 A | 5/1991 | Parkin | 360/113 |
| 5,432,734 A | 7/1995 | Kawano et al. | 365/158 |
| 5,452,163 A | 9/1995 | Coffey et al. | 360/113 |
| 5,920,446 A | 7/1999 | Gill | 360/113 |
| 5,998,106 A | 12/1999 | Merkel et al. | 430/389 |
| 6,063,244 A | 5/2000 | Pinarbasi | 204/192.11 |
| 6,198,608 B1 * | 3/2001 | Hong et al. | 360/320 |
| 6,329,087 B1 * | 12/2001 | Okamoto | 428/692 |
| 6,452,757 B1 * | 9/2002 | Yang et al. | 360/317 |
| 2001/0013997 A1 * | 8/2001 | Sasaki et al. | 360/317 |
| 2001/0014412 A1 * | 8/2001 | Jongill et al. | 428/692 |
| 2002/0024780 A1 * | 2/2002 | Mao et al. | 360/324.11 |
| 2002/0054463 A1 * | 5/2002 | Mukoyama et al. | 360/324.11 |
| 2002/0081457 A1 * | 6/2002 | Shimizu et al. | 428/692 |

FOREIGN PATENT DOCUMENTS

| | | | | |
|---|---|---|---|---|
| DE | 19652536 | 6/1997 | | H01L/43/08 |
| DE | 19720197 | 11/1998 | | H01L/43/08 |
| EP | 0 845 820 | 3/1998 | | H01L/43/08 |

OTHER PUBLICATIONS

Align Write Head Throat To Read Head Stripe By Plasma Etching Endpoint; Disclosed by International Business Machines Corporation; Research Disclosure, Dec. 1998 # 416123.

* cited by examiner

*Primary Examiner*—Paul Thibodeau
*Assistant Examiner*—Kevin M Bernatz
(74) *Attorney, Agent, or Firm*—Kunzler & Associates

(57) ABSTRACT

Disclosed is a spin-valve sensor disposed between first and second gap layers and formed of one or more in-situ oxidized films. The improved spin valve sensor helps eliminate electrical shorting between the spin-valve sensor and shield layers. A fabrication method of the gap layers comprises repeatedly depositing a metallic films on a wafer in a DC-magnetron sputtering module of a sputtering system, and then transferring the wafer in a vacuum to an oxidation module where in-situ oxidation is conducted. This deposition/in-situ oxidation process is repeated until a designed thicknesses of gap layers is attained. Smaller, more sensitive spin-valve sensors may be sandwiched between thinner gap layers formed of in-situ oxidized films, thus allowing for greater recording data densities in disk drive systems.

25 Claims, 8 Drawing Sheets

IN-SITU OXIDIZED FILMS FOR USE AS GAP LAYERS FOR A SPIN-VALVE SENSOR AND METHODS OF MANUFACTURE

RELATED APPLICATIONS

This application is a continuation-in-part of our co-pending patent application Ser. No. 09/919,280, filed on Jul. 31, 2001 for In-Situ Oxidized Films for Use as Cap and Gap Layers in a Spin-Valve Sensor and Methods of Manufacture.

BACKGROUND OF THE INVENTION

1. The Field of the Invention

The present invention relates to spin-valve sensors for reading information signals from a magnetic medium and more particularly to novel structures for spin-valve sensors and magnetic recording systems which incorporate such sensors.

2. The Relevant Art

Computer systems generally utilize auxiliary memory storage devices having magnetic media on which data can be written and from which data can be read for later use. A direct access storage device, such as a disk drive incorporating rotating magnetic disks, is commonly used for storing data in magnetic form on the disk surfaces. Data are recorded on concentric, radially spaced tracks on the disk surfaces. Magnetic recording heads carrying read sensors are then used to read data from the tracks on the disk surfaces.

In high capacity disk drives, a giant magnetoresistance (GMR) head carrying a spin-valve sensor is now extensively used to read data from the tracks on the disk surfaces. This spin-valve sensor typically comprises two ferromagnetic films separated by an electrically conducting nonmagnetic film. The resistance of this spin-valve sensor varies as a function of the spin-dependent transmission of conduction electrons between the two ferromagnetic films and the accompanying spin-dependent scattering which takes place at interfaces of the ferromagnetic and nonmagnetic films.

In the spin-valve sensor, one of the ferromagnetic films, referred to as a pinned layer, typically has its magnetization pinned by exchange coupling with an antiferromagnetic film, referred to as a pinning layer.

The magnetization of the other ferromagnetic film, referred to as a "sensing" or "free" layer is not fixed, however, and is free to rotate in response to the field from the magnetic medium (the signal field). In the spin-valve sensor, the GMR effect varies as the cosine of the angle between the magnetization of the pinned layer and the magnetization of the sensing layer. Recorded data can be read from a magnetic medium because the external magnetic field from the magnetic medium causes a change in the direction of magnetization in the sensing layer, which in turn causes a change in the resistance of the spin-valve sensor and a corresponding change in the sensed voltage.

FIG. 1 shows a typical prior art GMR head 100 comprising a pair of end regions 103 and 105 separated by a central region 102. The central region 102 is formed by depositing a spin-valve sensor 128 onto a bottom gap layer 118, which is previously deposited on a bottom shield layer 120, which is, in turn, previously deposited on a substrate. Two end regions 103 and 105 abut the edges of the central region 102. In the spin-valve sensor 128, a ferromagnetic sensing layer 106 is separated from a ferromagnetic pinned layer 108 by an electrically conducting nonmagnetic spacer layer 110. The magnetization of the pinned layer 108 is fixed through exchange coupling with an antiferromagnetic pinning layer 114. This spin-valve sensor includes seed layers 116, on which the pinning, pinned, spacer and sensing layers of the spin-valve sensor 128 grow with preferred crystalline textures during sputtering so that desired improved GMR properties are attained. The end regions 103 and 105 are also formed by depositing longitudinal bias (LB) and conducting lead layers 126 on the bottom gap layer 118 and at the spin-valve sensor 128. The end regions 103, 105 abut the central region 102. The central and end regions are sandwiched between electrically insulating nonmagnetic films, one referred as a bottom gap layer 118 and the other referred as a top gap layer 124.

The disk drive industry has been engaged in an ongoing effort to increase the recording density of the hard disk drive, and correspondingly to increase the overall signal sensitivity to permit the GMR head of the hard disk drive to read smaller changes in magnetic fluxes. The major property relevant to the signal sensitivity of a spin-valve sensor in the GMR head is its GMR coefficient. A higher GMR coefficient leads to higher signal sensitivity and enables the storage of more bits of information on a disk surface of a given size. The GMR coefficient of the spin-valve sensor is expressed as $\Delta R_G/R_H$, where $R_H$ is a resistance measured when the magnetizations of the free and pinned layers are parallel to each other, and $\Delta R_G$ is the maximum giant magnetoresistance (GMR) measured when the magnetizations of the free and pinned layers are antiparallel to each other.

In certain spin-valve sensors, particularly those with Co—Fe/Ni—Fe films as sensing layers 106, a cap layer 112 is often formed over the sensing layers. The cap layer 112 serves several purposes, and plays a crucial role in attaining a high GMR coefficient. For instance, a Cu cap layers is thought to induce spin filtering, while a Cu—O cap layer is thought to induce specular scattering. Both spin filtering and specular scattering are believed to increase the GMR coefficient of a spin-valve sensor. In addition, a cap layer may be employed to prevent the underlying sensing layers from interface mixing occurring immediately during depositions and oxygen diffusion occurring during subsequent annealing, thereby maintaining suitably soft magnetic properties of the sensing layer and improving the thermal stability of the spin-valve sensor. The term "soft magnetic property" refers to the capability of a spin-valve sensor to sense very small magnetic fields.

Currently, a Ta cap layer is used in many conventional spin-valve sensors. However, the Ta cap layer does not exhibit desired specular scattering, and is considered inadequate in preventing the sensing layers from interface mixing and oxygen diffusion. Interface mixing originates from direct contact between the sensing layers and the Ta cap layer, and causes a substantial loss in the magnetic moment of the sensing layers. For one currently used spin-valve sensor with 0.32 memu/cm² sensing layers, this magnetic moment loss accounts for 25% of the magnetic moment of the sensing layers. Oxygen diffusion originates from low passivity of the Ta cap layer, which oxidizes continuously and entirely during annealing, such that oxygen eventually penetrates into the sensing layers, causing more losses in the magnetic moment of the sensing layers.

Another limiting factor of the disk drive recording density is the dimensions of the GMR head. The recording density of the disk drive is inversely proportional to the total thickness of the spin-valve sensor, the gap layers 118 and 124. In other words, in order to increase the disk drive recording density the thicknesses of the spin-valve sensor, the gap layers 118 and 124 must be decreased. Several challenges have arisen in the miniaturization of the gap layers 118 and 124.

The primary duties of the gap layers 118 and 124 are to prevent electrical shorting between the spin-valve sensor 128 and the shield layers 120 and 130, and thus to ensure the functionality of the spin-valve sensor 128. In order to prevent this electrical shorting, a spin-valve sensor must be sandwiched between gap layers 118 and 124 of substantial thicknesses. The gap layers 118 and 124 have been a limiting factor in the miniaturization of the GMR head 100, because as the thicknesses of the gap layers 118 and 124 decreases, the possibility of electrical shorting increases, causing the GMR head to be non-functional.

Thus, it can be seen from the above discussion that there is a need existing in the art for an improved spin-valve sensor with an increased GMR coefficient, and for improved gap layers with decreased thicknesses.

OBJECTS AND BRIEF SUMMARY OF THE INVENTION

The apparatus of the present invention has been developed in response to the present state of the art, and in particular, in response to the problems and needs in the art that have not yet been fully solved by currently available GMR heads. Accordingly, it is an overall object of the present invention to provide an improved GMR head that overcomes many or all of the above-discussed shortcomings in the art.

To achieve the foregoing object, and in accordance with the invention as embodied and broadly described herein in the preferred embodiments, an improved GMR head comprises an improved spin-valve sensor and improved top and bottom gap layers formed using a deposition/in-situ oxidation process of the present invention. A method of the present invention is also presented for forming a gap layer from a plurality of in-situ oxidized metallic films using the deposition/in-situ oxidation process.

In one embodiment, the top and bottom gap layers preferably formed of multilayer in-situ oxidized Al films are formed on a wafer. The deposition/in-situ oxidation process is repeated until selected thicknesses of the top and bottom gap layers are attained. Full in-situ oxidization of the top and bottom gap layers is preferred for attaining high breakdown voltages.

The improved GMR head of the present invention is preferably incorporated within a disk drive system configured substantially in the manner described above. In addition, the spin-valve sensor of the improved GMR head of the present invention may comprise a cap layer formed of an in-situ oxidized metal film. In one embodiment, the film is Al, Hf, Si, Y, or Zr. In alternate embodiments of the invention, a noble metallic film, e.g., Au, Cu, Rh, or Ru may be sandwiched between a sensing layer and an in-situ oxidized cap layer.

In one embodiment, a bottom shield layer preferably formed of a Ni—Fe film and a bottom gap layer preferably formed of an $Al_2O_3$ film are deposited on a wafer. Multiple seed layers preferably formed of $Al_2O_3$, Ni—Cr—Fe and Ni—Fe films are deposited on the bottom gap layer. A pinning layer preferably formed of a Pt—Mn film is then deposited on the multiple seed layers. Pinned layers preferably formed of Co—Fe, Ru and Co—Fe films are then deposited on the pinning layer. A spacer layer preferably formed of an oxygen-doped, in-situ oxidized Cu—O film is then deposited on the pinned layer. Sensing layers preferably formed of Co—Fe and Ni—Fe films are then deposited on the spacer layer. A cap layer preferably formed of an in-situ oxidized Al film (Al—O) is then formed on the sensing layer with a deposition/in-situ oxidization process. In-situ oxidization is preferred for attaining a high GMR coefficient.

The deposition/in-situ oxidation process preferably comprises depositing a metallic film in a vacuum in a DC magnetron sputtering module, and then conducting the in-situ oxidization for a wide range of time in a wide range of oxygen pressures in an oxidation module. In one embodiment given by way of example, the in-situ oxidization is conducted for a period of about 8 minutes in an oxygen gas of about 0.5 Torr. In another embodiment given by way of example, the in-situ oxidization is conducted for a period of about 4 minutes in an oxygen gas of about 2 Torr. The exposure to oxygen is preferably conducted with a moderate temperature, such as ambient room temperature.

The top and bottom gap layers are preferably deposited using the deposition/in-situ oxidization process of the present invention. In order to achieve designed thicknesses, multiple layers may be alternatively deposited and in-situ oxidized using the deposition/in-situ oxidation process. Preferably, when forming the top and bottom gap layers, the alternating oxidized layers are fully oxidized.

These and other objects, features, and advantages of the present invention will become more fully apparent from the following description and appended claims, or may be learned by the practice of the invention as set forth hereinafter.

BRIEF DESCRIPTION OF THE DRAWINGS

In order that the manner in which the advantages and objects of the invention are obtained will be readily understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 2:
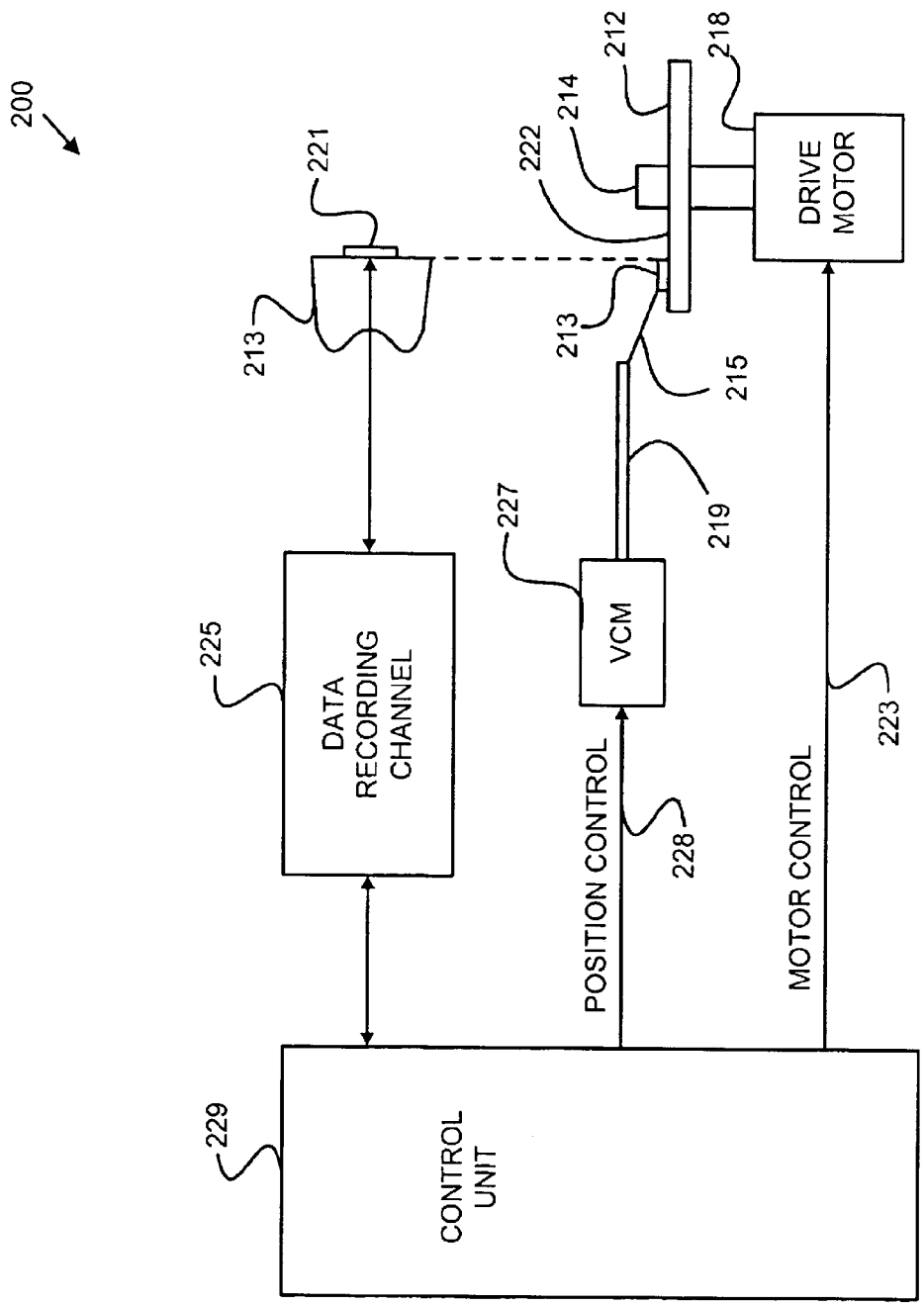
FIG. 2 is a schematic block diagram illustrating a magnetic recording disk drive system.

FIG. 2 schematically depicts one example of a disk drive 200 suitable for incorporating a GMR head of the present invention. As shown in FIG. 2, the disk drive 200 comprises at least one rotatable magnetic disk 212 supported on a spindle 214 and rotated by a disk drive motor 218. The magnetic recording media on each magnetic disk 212 is in the form of concentric, annular data tracks (not shown).

At least one slider 213 is positioned on the magnetic disk 212. Each slider 213 supports one or more magnetic read/write heads 221 incorporating the GMR head of the present invention. As the magnetic disk 212 rotates, the slider 213 moves back and forth across the disk surface 222, so that the read/write heads 221 may access different portions of the magnetic disk 212 where desired data are recorded. Each slider 213 is attached to an actuator arm 219 by means of a suspension 215. The suspension 215 provides a slight spring force which biases the slider 213 against the magnetic disk surface 222. Each actuator arm 219 is attached to an actuator 227.

The actuator 227 as shown in FIG. 2 may be a voice coil motor (VCM). The VCM comprises a coil movable within a fixed magnetic field, and the direction and speed of the coil movements are controlled by the motor current signals supplied by a controller 229.

During operation of the disk storage system, the rotation of the magnetic disk 212 generates an air bearing between the slider 213 and the disk surface 222 which exerts an upward force or lift on the slider 213. The air bearing thus counter-balances the slight spring force of the suspension 215 and supports the slider 213 off and slightly above the disk surface by a small, substantially constant spacing during normal operation. The surface of the slider 213, which includes the head 221 and faces the surface of disk 212, is referred to as an air bearing surface (ABS).

The various components of the disk storage system are controlled in operation by control signals generated by the control unit 229. The control signals include access control signals and internal clock signals. Typically, the control unit 229 comprises logic control circuits, storage means, and a microprocessor. The control unit 229 generates control signals to control various system operations such as drive motor control signals on a line 223 and head position and seek control signals on a line 228. The control signals on the line 228 provide the desired current profiles to optimally move and position the slider 213 to the desired data track on the magnetic disk 212. Read and write signals are communicated to and from the read/write heads 221 by means of a recording channel 225. In the depicted embodiment, the read/write heads 221 incorporate a spin-valve sensor of the present invention.

Figure 3:
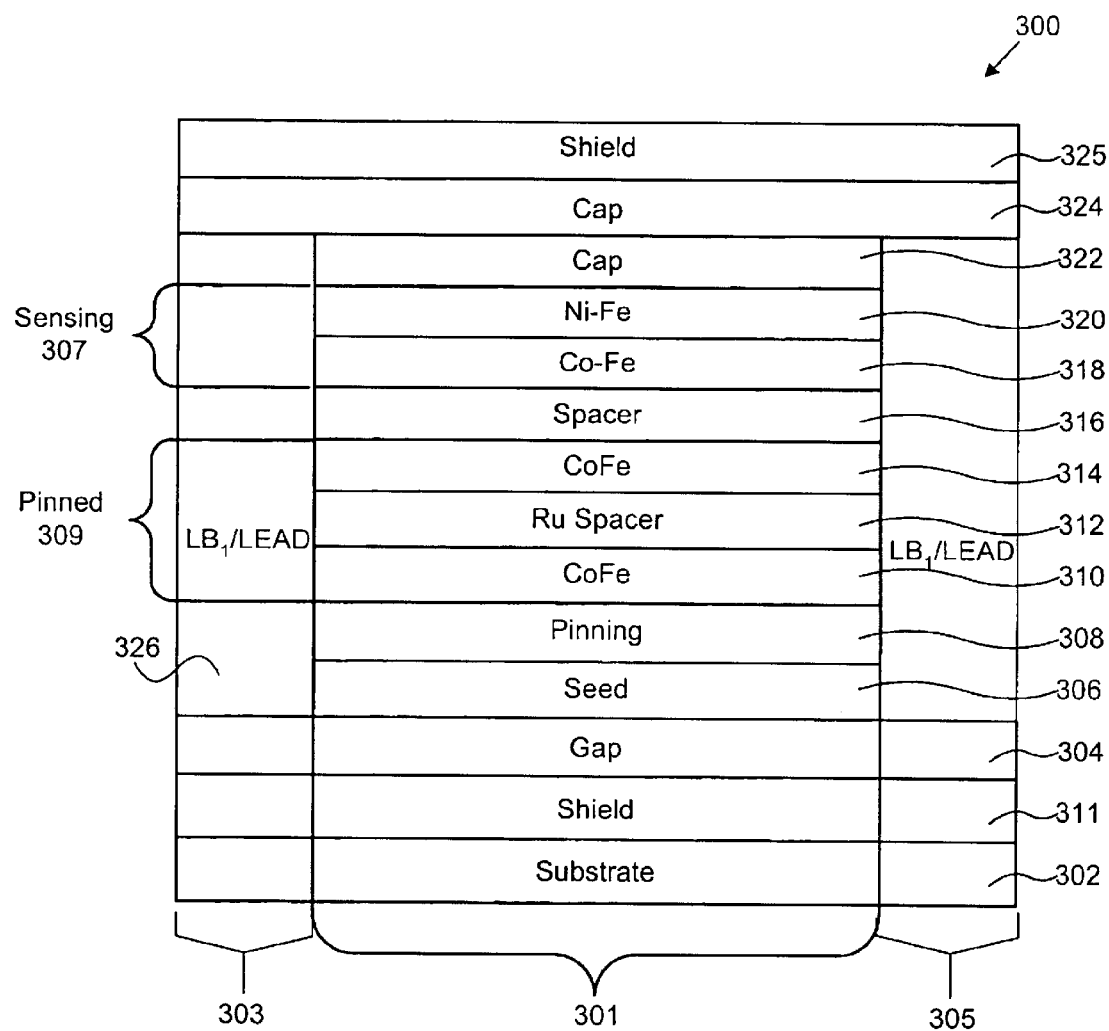
FIG. 3 is a cross-sectional view illustrating the structure of a GMR head in accordance with one embodiment of the present invention.

Referring now to FIG. 3, shown therein is one embodiment of a GMR head 300 employing the in-situ oxidized films of the present invention. While the GMR head 300 is discussed in relation to one example of a GMR sensor, the present invention is also applicable to other GMR sensors, the construction of which should be readily apparent from the present discussion.

The depicted GMR head 300 includes a bottom-type synthetic spin-valve sensor, but of course, other types of spin-valve sensors may also be formed using the novel in-situ process of the present invention. The depicted GMR head 300 comprises a pair of end regions 303, 305 separated by a central region 301. The central region 301 is formed by depositing the spin-valve sensor 328 on a bottom gap layer 304. The end regions 303 and 305 are formed by depositing longitudinal bias (LB) and conducting lead layers 326 on a bottom gap layer 304. The end regions 303, 305 abut the central region 301.

In accordance with one embodiment, ferromagnetic sensing layers 307 (often collectively referred to as "free layers") are shown separated from ferromagnetic pinned layers 309 by a spacer layer 316. In one embodiment, the spacer layer 316 is anon-magnetic 22 Å thick, electrically-conducting, oxygen-doped, in-situ oxidized Cu (Cu—O) film. Under one embodiment of the present invention, the sensing layers 307 comprise a 9 Å thick Co—Fe film 318 and an adjacent 27 Å thick Ni—Fe film 320. The pinned layer 309 comprises a 20 Å thick Co—Fe film 310, an 8 Å thick Ru film 312, and a 22 Å thick Co—Fe film 314. The magnetizations of the pinned layers 309 are fixed through exchange coupling with a 200 Å thick antiferromagnetic Pt—Mn pinning layer 308.

One manner of forming the GMR head 300 of FIG. 3 will be discussed herein by way of example. In the depicted embodiment, a bottom shield layer 311, preferably formed of a 1 μm thick Ni—Fe film, and a bottom gap layer 304, preferably formed of a 100 Å thick $Al_2O_3$ film, are deposited on a wafer 302. Seed layers 306 may then be deposited on the bottom gap layer 304.

In one embodiment, multiple seed layers 306, preferably formed of a 30 Å thick $Al_2O_3$ film, a 30 Å thick Ni—Cr—Fe film, and a 10 Å thick Ni—Fe film, are deposited on the bottom gap layer 304. The 100 Å thick $Al_2O_3$ film used as the bottom gap layer 304 may be sputter-deposited in an argon gas from an $Al_2O_3$ target, while the 30 Å thick $Al_2O_3$ film used as the seed layer is preferably reactively sputter-deposited from an Al target in mixed gases of argon and oxygen. The multiple seed layers are used to provide a desirable surface with a strong face-centered-cubic (FCC) {111} crystalline texture and coarse polycrystalline grains on which the remaining layers of the spin-valve sensor may be grown epitaxially in order to attain a high GMR coefficient.

An antiferromagnetic pinning layer 308, preferably formed of a 200 Å thick Pt—Mn film, is then, under this embodiment, deposited on the seed layers 306. The pinned layers 309, preferably formed of a 20 Å thick Co—Fe film, an 8 Å thick Ru film, and a 22 Å thick Co—Fe film, are then deposited on the pinning layer 308. A spacer layer 316, preferably formed of an oxygen-doped, in-situ oxidized 22 Å thick Cu (Cu—O) film, is then deposited on the pinned layer 309. Sensing layers 307 are then formed, preferably of a 9 Å thick Co—Fe film 318 and a 27 Å thick Ni—Fe film 320, on the spacer layer 316. A cap layer 322, preferably formed of an in-situ oxidized Al film (Al—O), is then formed on the sensing layers 307. The cap layer 322 is preferably formed with the in-situ deposition/oxidization process of the present invention, one example of which is discussed below with respect to FIG. 7.

The cap layer 322 may be formed of any suitable in-situ oxidized film, examples of which include in-situ oxidized Al, Hf, Si, Y, and Zr films. An in-situ oxidized Al film is considered to be particularly effective, due to its amorphous state which is thought to promote high specular scattering.

In addition, a metallic film may be disposed between the sensing layer 307 and the cap layer 322. In one embodiment, the metallic film comprises a Cu film with a thickness in a range of between about 6 Å and about 12 Å.

A top gap layer 324 is then preferably formed on the cap layer 322. In one embodiment, the top gap layer 324 is a 100 Å thick $Al_2O_3$ film. A top shield layer 325 may then be formed on top of the top gap layer 324. In one embodiment, the top shield layer 325 is formed of a 1 μm thick Ni—Fe film.

Figure 1:
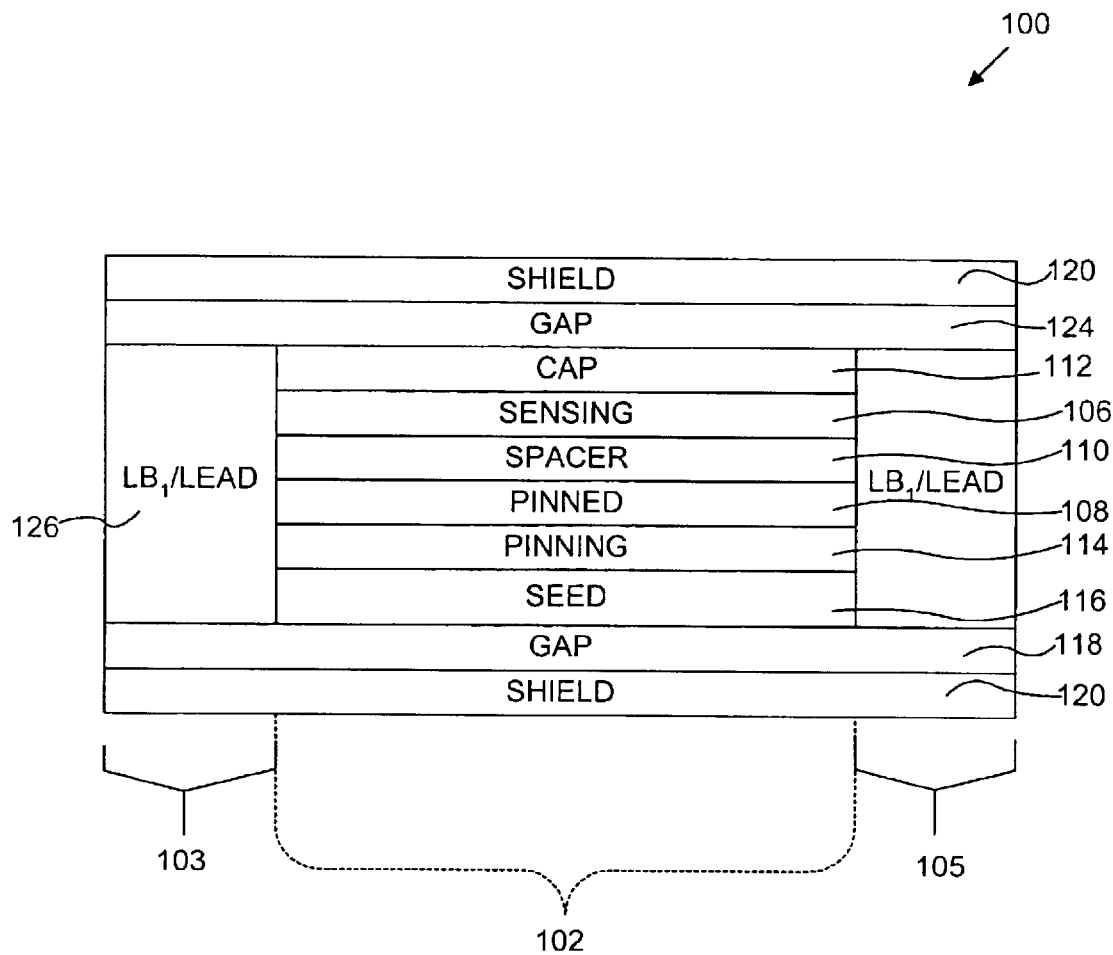
FIG. 1 is a cross-sectional view illustrating the structure of a GMR head of the prior art.

The low-passivity Ta film of the prior art cap layer (112 of FIG. 1) oxidizes continuously and entirely. In contrast, using the deposition/in-situ oxidation process of the present invention, a high-passivity film is oxidized only at its surface, resulting in a natural oxide cap layer which is dense and highly protective against oxygen diffusion into the sensing layer.

The cap layer of the present invention is preferably only partially oxidized, with the upper portion of the film oxidized, while the lower portion of the film directly adjacent the sensing layer remains intact and substantially free from oxygen. The natural dense oxide layer formed in the upper portion of the film is thought to provide higher specular scattering than a thick oxide film either sputtered from an oxide target or reactively sputtered from a metallic target in mixed gases of argon and oxygen. This high specular scattering causes a substantial increase in the GMR coefficient of the spin-valve sensor.

In addition, severe interface mixing between the sensing layer and a conventional Ta cap layer is substantially reduced, and oxygen penetration from the conventional Ta layer into the sensing layer is prevented. As a result, the soft magnetic properties of the sensing layers are substantially improved. In the preferred embodiments, the in-situ oxidized film is thick enough to ensure the metallic contact with the sensing layer after the in-situ oxidation, but is also thin enough to avoid current shunting, which reduces the GMR coefficient. Hence, to form the in-situ oxidized cap layer in one example, an 8 Å thick Al film is deposited and in-situ oxidized for 8 min in an oxygen gas of 0.5 Torr. After the in-situ oxidization, an approximately 10 Å thick in-situ oxidized Al (Al—O) film is formed. The in-situ oxidized Al film when used as a cap layer is preferably only partially oxidized, as discussed below with respect to FIG. 4.

To further reduce interface mixing and thereby further improve the soft magnetic properties of the sensing layers, the metallic contact between the sensing and cap layers must be enforced. To enforce this metallic contact, the deposition/in-situ oxidation process may also be applied to noble metallic films with even higher passivity (e.g., Au, Cu, Rh, Ru, etc.) after the deposition of the sensing layers and before the deposition/in-situ oxidation processes applied to the Al film. To form this additional in-situ oxidized cap layer, an 8 Å thick noble metallic film is also deposited and in-situ oxidized for 8 min in an oxygen gas of 0.5 Torr. After the in-situ oxidization, an approximately 10 Å thick in-situ oxidized noble metallic film is formed.

Figure 4:
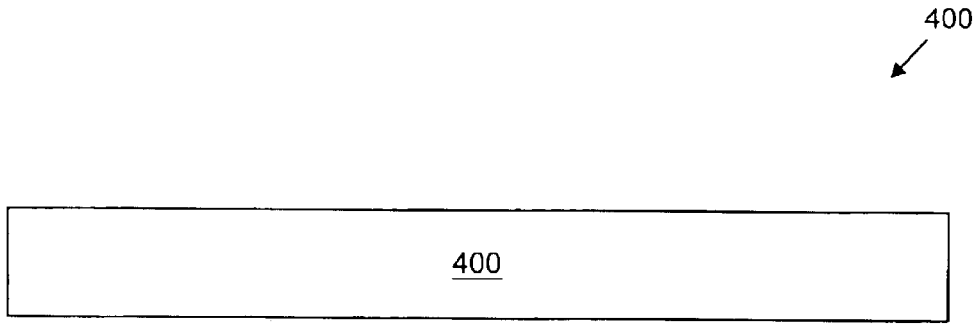
FIG. 4 is a schematic block diagram illustrating the structure of a cap layer in one embodiment of the present invention.

FIG. 4 illustrates one embodiment of an oxidized metallic film 400 which may be formed with the deposition/in-situ oxidization process of the present invention. When used as a cap layer (e.g., 322 of FIG. 3), the thickness of the partially oxidized film 400 is preferably in a range of between about 5 and about 15 Å. The spin-valve sensor of the GMR head 300 may be sandwiched between the top and bottom gap layers 324 and 304, which are formed of a plurality of in-situ oxidized layers, which will be explained in greater detail below with reference to FIG. 5.

Figure 5:
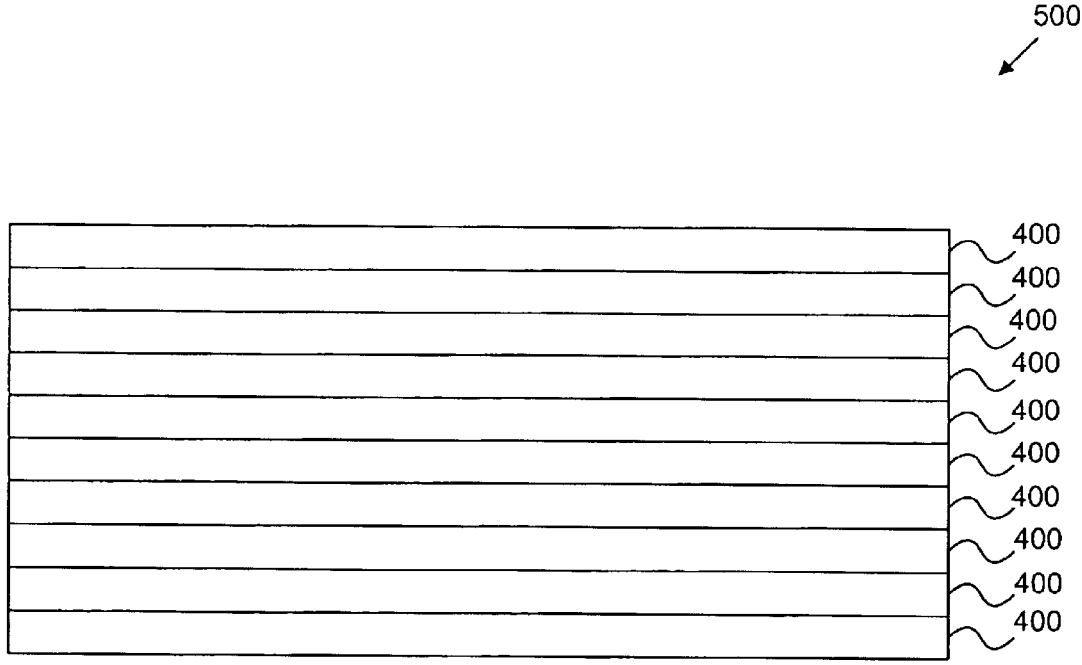
FIG. 5 is a schematic block diagram illustrating a plurality of in-situ oxidized Al films in an alternative embodiment of the present invention.

FIG. 5 illustrates an alternative embodiment in which repeated deposition/in-situ oxidation processes are used to form the top and bottom gap layers 324 and 304. The top and bottom gap layers 324 and 304 maybe formed of a plurality of in-situ oxidized metallic Al films 400. The deposition/in-situ oxidation process is repeated until designed thicknesses of the top and bottom gap layers 324 and 304 are attained. Each in-situ oxidized film 400 is formed in the manner described with respect to FIG. 4. While reactive pulsed-DC magnetron sputter-deposition of an $Al_2O_3$ film is preferred for the first seed layer (which can also be treated as part of the bottom gap layer 304), full in-situ oxidation is preferred for the bottom gap layer 304 to ensure high breakdown voltages.

While in-situ partial oxidation is preferred for the cap layer (which can also be treated as part of the top gap layer 324), full in-situ oxidation is also preferred for the top gap layer 324 to also ensure high breakdown voltages. Hence in one example, to form each in-situ oxidized film as part of the top and bottom gap layer 324 and 304, an Al film is deposited and in-situ oxidized for 16 min in an oxygen gas of 2 Torr. In another example, the Al film is oxidized for a longer time in the oxygen gas with a higher pressure. The deposition/in-situ oxidation process is repeated until the designed thickness is attained. In one example, each in-situ oxidized film has a thickness of about 10 Å and 10 layers are deposited. In a further example, up to 20 layers are deposited.

Figure 6:
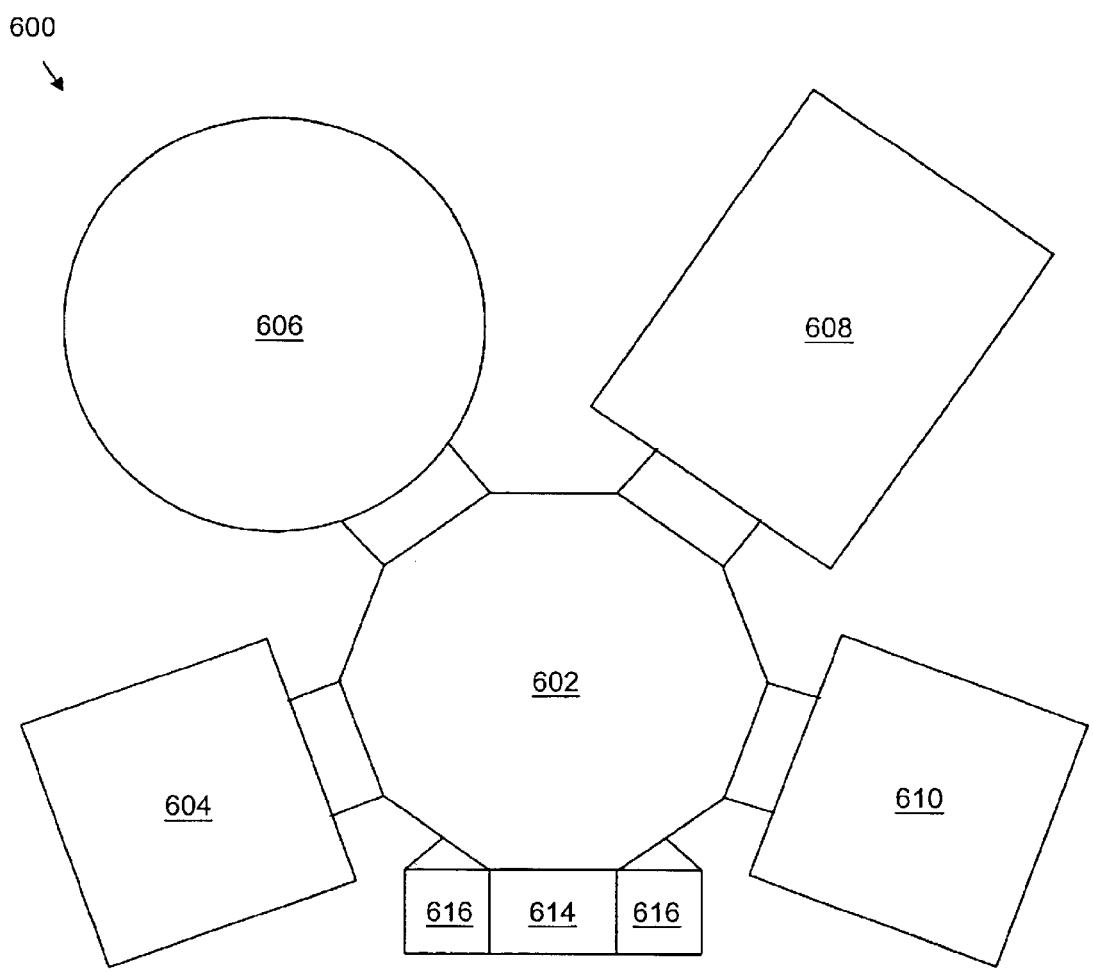
FIG. 6 is a schematic block diagram illustrating an integrated DC magnetron/ion beam sputtering system suitable for use with the present invention.

Referring now to FIG. 6, shown therein is one embodiment of an integrated DC magnetron/ion beam sputtering system 600 suitable for fabricating the GMR head 300 and for conducting the deposition/in-situ oxidation process of the present invention. The sputtering system 600 of FIG. 6 is sold by the Veeco Corporation of Plainview, N.Y. The sputtering system 600 as depicted comprises a transport module 602 surrounded by a first single-target DC magnetron sputtering module 604, a multi-target DC magnetron sputtering module 606, a multi-target ion beam sputtering module 608, and a second single-target DC magnetron sputtering module 610. Two loadlocks 616 allow the ingress and egress of wafers. A control panel 614 controls the parameters and processes of the sputtering system 600.

Figure 7:
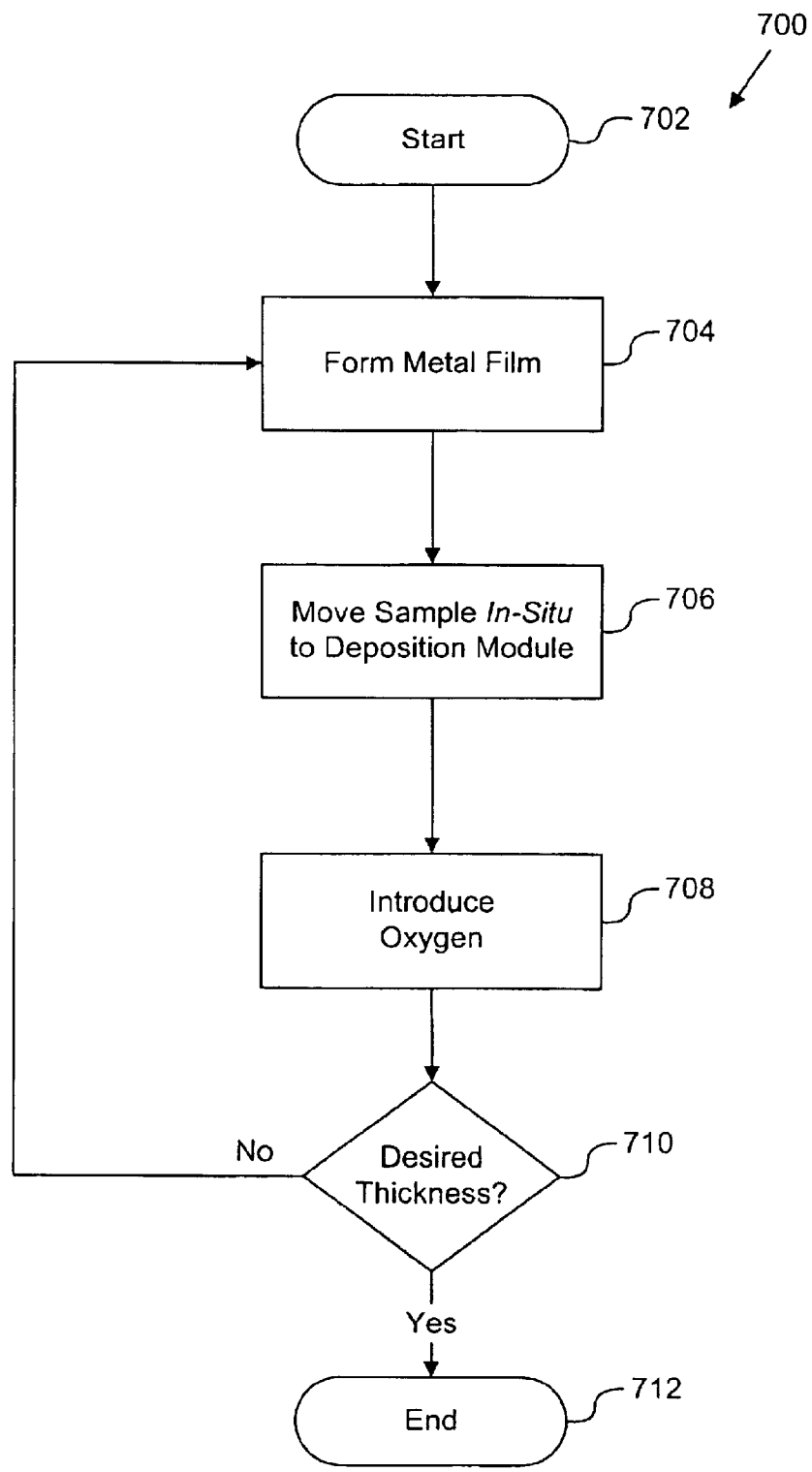
FIG. 7 is a schematic flow chart illustrating a method for deposition/in-situ oxidization of the present invention.

FIG. 7 is a schematic flow chart illustrating one embodiment of a method 700 of forming in-situ oxidized films of the present invention. The method 700 starts 702 and a metallic film is formed by sputter-deposition 704, preferably using an integrated DC-magnetron/ion beam sputtering system, such as that described with reference to FIG. 6. Under the preferred embodiment of the present invention, the sputter-deposition 704 of the metallic film is accomplished in an atmosphere of argon gas of 3 mTorr.

Once the desired thickness of the metallic film on the wafer has been achieved, the wafer is moved in a vacuum 706 through the transport module 602 to the single-target DC magnetron module 604 or 610, which can be used as an in-situ oxidization module. The metallic film 504 is then in-situ oxidized in the oxidization module 604 or 610, where the oxygen gas is introduced 708. In one embodiment, the pressure of the oxygen gas in the oxidization module 604 or 610 is in a range of about 0.5 to about 10 Torr. To ensure full in-situ oxidation, the pressure of the oxygen gas in the in-situ oxidation module 604 or 610 is preferably 2 Torr or greater. The temperature is preferably maintained at about room temperature (i.e., about 70° F.).

The full in-situ oxidation of the embodiment of FIG. 5 is conducted for a period of time of about 16 min in an oxygen gas of 2 Torr. The in-situ oxidization is preferably a natural oxidization performed at ambient room temperature. When used to form multilayer films such as the embodiment of FIG. 5, the method 700 is repeated, until determining 710 that the selected number of layers or designed thickness has been reached. The method 700 then ends 712.

In one embodiment, the sputtering system 600 and deposition/in-situ oxidation method 700 are used in the fabrication of a GMR head with cap and gap layers all formed of in-situ oxidized Al films. In this embodiment, the read gap thickness is designed to be as small as 600 Å for magnetic recording at ultrahigh densities ($\geq$30 Gb/in$^2$). To attain this read gap thickness, the spin-valve sensor of the GMR head is sandwiched between 100 Å thick Al—O top and bottom gap layers.

The bottom gap layer 304 formed of 10 layers of in-situ oxidized Al films are formed on a wafer in the first single-target DC magnetron sputtering module 604. The deposition/in-situ oxidation process is repeated 10 times until a 100 Å thick bottom gap layer is attained. To ensure full in-situ oxidization that is preferred for attaining a high breakdown voltage, the deposition of an Al film with DC magnetron sputtering from a pure Al target in an argon gas of 3 mTorr and the subsequent in-situ oxidation for 16 minutes in an oxygen gas of 2 Torr are conducted alternatively for a total of 10 times.

After the formation of the bottom gap layer 304 in the first single-target DC magnetron sputtering module 604, the wafer is then transferred to the second single-target DC magnetron sputtering module 610 for the deposition of the first seed layer that is in one embodiment formed of a 30 Å thick Al$_2$O$_3$ film. The Al$_2$O$_3$ film is deposited, preferably with reactive pulsed-DC magnetron sputtering from a pure Al target in mixed argon and oxygen gases of 2.25 and 0.75 mTorr, respectively. This Al$_2$O$_3$ film when used as a seed layer in disclosed embodiments plays a significant role in increasing the {111} crystalline textures of subsequently deposited films and in improving the GMR coefficient of the spin-valve sensor. In contrast, an Al—O film, formed with the deposition/in situ oxidation process, has been found to be a non-suitable seed layer.

The wafer is then transferred to the multi-target ion beam sputtering module 608 for the deposition of the second and third seed layers that may be formed of a 30 Å thick Ni—Fe—Cr film and a 10 Å thick Ni—Fe film, respectively. The Ni—Cr—Fe and Ni—Fe films are preferably deposited in a xenon gas of 0.12 mTorr.

The wafer is then transferred to the multi-target DC magnetron sputtering module 606 for the deposition of the remaining layers of the spin-valve sensor, in one embodiment including a 200 Å thick Pt—Mn film, a 20 Å thick Co—Fe film, an 8 Å thick Ru film, a 22 Å thick Co—Fe film, an oxygen-doped/in-situ oxidized 22 Å thick Cu (Cu—O) film, a 9 Å thick Co—Fe film, a 27 Å thick Ni—Fe film, and a 10 Å thick in-situ oxidized Al (Al—O) film. All the metallic films except the Cu—O film are deposited in an argon gas of 3 mTorr and in a magnetic field of 40 Oe parallel to an alignment mark. To form the Cu—O film, a Cu film is deposited in mixed argon and oxygen gases of 2.985 and 0.015 mTorr, respectively, and then in-situ oxidized in mixed argon and oxygen gases of 2.94 and 0.06 mTorr for 4 minutes, respectively. To form the Al—O film, an Al film is deposited in an argon gas of 3 mTorr and then in-situ oxidized in an oxygen gas of 0.5 Torr for 8 minutes.

In addition, to form an additional Cu—O or Ru—O film before the formation of the Al—O film, a Cu or Ru film is deposited in an argon gas of 3 mTorr and then in-situ oxidized in an oxygen gas of 0.5 Torr for 8 minutes.

After the depositions, the wafer is annealed for 300 minutes at 265° C. in a magnetic field of 10 kOe perpendicular to an alignment mark. After annealing, a 30 Å thick Ta film is deposited for the use as an adhesion layer for photoresist layers applied in the subsequent patterning process. In this patterning process, bilayer photoresists are applied and exposed in a photolithographic tool to mask the spin-valve sensor in a central region, and then developed in a solvent to form an undercut. The spin-valve sensor in unmasked end regions is removed by ion milling until the Al$_2$O$_3$ first seed layer is exposed, and longitudinal bias (LB) and first conducting leads (LD$_1$) layers are immediately deposited.

Subsequently, the bilayer photoresists are lifted off and a similar patterning process continues for the deposition of second conducting leads (LD$_2$) layers. Ion milling or reactive ion etching is applied to remove the 30 Å thick Ta film. The top gap layer-formed of 10 layers of in-situ oxidized Al films is then formed on the wafer in the first single-target DC magnetron sputtering module 604. The deposition/in-situ oxidation process is repeated 10 times until about a 100 Å thick top gap layer is attained. To ensure full in-situ oxidization preferred for attaining high breakdown voltage, the deposition of O) film, a 9 Å thick Co—Fe film, a 27 Å thick Ni—Fe film, and a 10 Å thick in-situ oxidized Al (Al—O) film. All the metallic films except the Cu—O film are deposited in an argon gas of 3 mTorr and in a magnetic field of 40 Oe parallel to an alignment mark. To form the Cu—O film, a Cu film is deposited in mixed argon and oxygen gases of 2.985 and 0.015 mTorr, respectively, and then in-situ oxidized in mixed argon and oxygen gases of 2.94 and 0.06 mTorr for 4 minutes, respectively. To form the Al—O film, an Al film is deposited in an argon gas of 3 mTorr and then in-situ oxidized in an oxygen gas of 0.5 Torr for 8 minutes.

In addition, to form an additional Cu—O or Ru—O film before the formation of the Al—O film, a Cu or Ru film is deposited in an argon gas of 3 mTorr and then in-situ oxidized in an oxygen gas of 0.5 Torr for 8 minutes.

After the depositions, the wafer is annealed for 300 minutes at 265° C. in a magnetic field of 10 kOe perpendicular to an alignment mark. After annealing, a 30 Å thick Ta film is deposited for the use as an adhesion layer for photoresist layers applied in the subsequent patterning process. In this patterning process, bilayer photoresists are applied and exposed in a photolithographic tool to mask the spin-valve sensor in a central region, and then developed in a solvent to form an undercut. The spin-valve sensor in unmasked end regions is removed by ion milling until the Al$_2$O$_3$ first seed layer is exposed, and longitudinal bias (LB) and first conducting leads (LD$_1$) layers are immediately deposited.

Subsequently, the bilayer photoresists are lifted off and a similar patterning process continues for the deposition of second conducting leads (LD$_2$) layers. Ion milling or reactive ion etching is applied to remove the 30 Å thick Ta film. The top gap layer-formed of 10 layers of in-situ oxidized Al films is then formed on the wafer in the first single-target DC magnetron sputtering module 604. The deposition/in-situ oxidation process is repeated 10 times until about a 100 Å thick top gap layer is attained. To ensure full in-situ oxidization preferred for attaining high breakdown voltage, the deposition of an Al film with DC magnetron sputtering from a pure Al target in an argon gas of 3 mTorr and its in-situ oxidation in an oxygen gas of 2 Torr for 16 minutes are conducted alternatively for 10 times.

The spin-valve sensors fabricated as described in this invention have been found to exhibit much better magnetic properties than a conventional spin-valve sensor with a Ta seed layer and a Ta cap layer.

Table 1 lists magnetic and magnetoresistive properties of spin-valve sensors used in the prior art and in this invention.

TABLE 1

| | | | | |
|---|---|---|---|---|
| Seed Layer | Ta | Al$_2$O$_3$/Ni—Cr—Fe/Ni—Fe | Al$_2$O$_3$/Ni—Cr—Fe/Ni—Fe | Al$_2$O$_3$/Ni—Cr—Fe/Ni—Fe |
| Cap Layer | Ta | Al—O | Cu—O/Al—O | Ru—O/Al—O |
| m$_1$ (memu/cm$^2$) | 0.28 | 0.32 | 0.32 | 0.32 |
| λ$_S$ (×10$^{-6}$) | -0.3 | +0.15 | -1.2 | -1.58 |
| H$_C$ (Oe) | 14.3 | 6.2 | 6.2 | 6.2 |
| H$_F$ (Oe) | -25.3 | -6.6 | -12.1 | -12.5 |
| R$_{//}$ (Ω/ ) | 20.2 | 16.6 | 15.6 | 16.4 |
| ΔR$_G$/R$_{//}$ (%) | 7.7 | 13.8 | 13.4 | 13.4 |
| ΔR$_G$ (Ω/ ) | 1.56 | 2.29 | 2.09 | 2.20 |

The replacement of the Ta cap layer with the in-situ oxidized cap layer causes an increase in the areal magnetic moment of the sensing layer (m$_1$) from 0.28 to 0.32 memu/cm$^2$, a decrease in the amplitude of the ferromagnetic coupling field (|H$_F$|) from 25.3 to 6.6 Oe, and a decrease in the easy-axis coercivity (H$_C$) from 14.3 to 6.2 Oe. These changes in magnetic properties may originate from substantially reduced interface mixing at the interface between the sensing and in-situ oxidized cap layers. The replacements of the Ta seed and Ta cap layers with the Al$_2$O$_3$/Ni—Cr—Fe/Ni—Fe seed and Al—O cap layers, respectively, cause a decrease in the sheet resistance of the spin-valve sensor (R$_H$) from 20.2 to 16.6 Ω, but an increase in the GMR coefficient (ΔR$_G$/R$_H$) from 7.7 to 13.8%. These changes in magnetoresistive properties may originate from grain coarsening in the spin-valve sensor due to recrystalization in the Ni—Cr—Fe/Ni—Fe films, and improved specular scattering at the interface between the sensing and in-situ oxidized cap layers.

In addition, the sandwiching of the Cu—O or Ru—O cap layer between the sensing and Al—O cap layers causes a slight decrease in ΔR$_G$/R$_H$, and a transition in the saturation magnetostriction of the sensing layer (λ$_S$) from positive to negative values. This transition may originate from an enforced metallic contact between the sensing and cap layers. This negative λ$_S$ is preferred and is typically controlled in a range from -2×10$^{-6}$ to -1×10$^{-6}$ for improving magnetic and thermal stability of the spin-valve sensor. Hence, in spite of the fact that the use of the Cu—O or Ru—O cap layer causes the slight decrease in ΔR$_G$/R$_H$, it may nevertheless be employed for improving magnetic and thermal stability of the spin-valve sensor.

The in-situ oxidation process of the present invention may also be applied to other types of read heads, one example of which includes, a tunneling magnetoresistance (TMR) head comprising a magnetic-tunnel-junction sensor. The TMR sensor is well known in the art and shares a similar structure to the GMR head, discussed by way of example herein. Nevertheless, the application of the in-situ formed gap layers of the present invention is also applicable to the TMR sensor, as will be discussed. While one example of a TMR head having a TMR sensor of the prior art will be discussed here, the present invention likewise applies to other TMR heads, the construction of which should be readily apparent from the present discussion.

Figure 8:
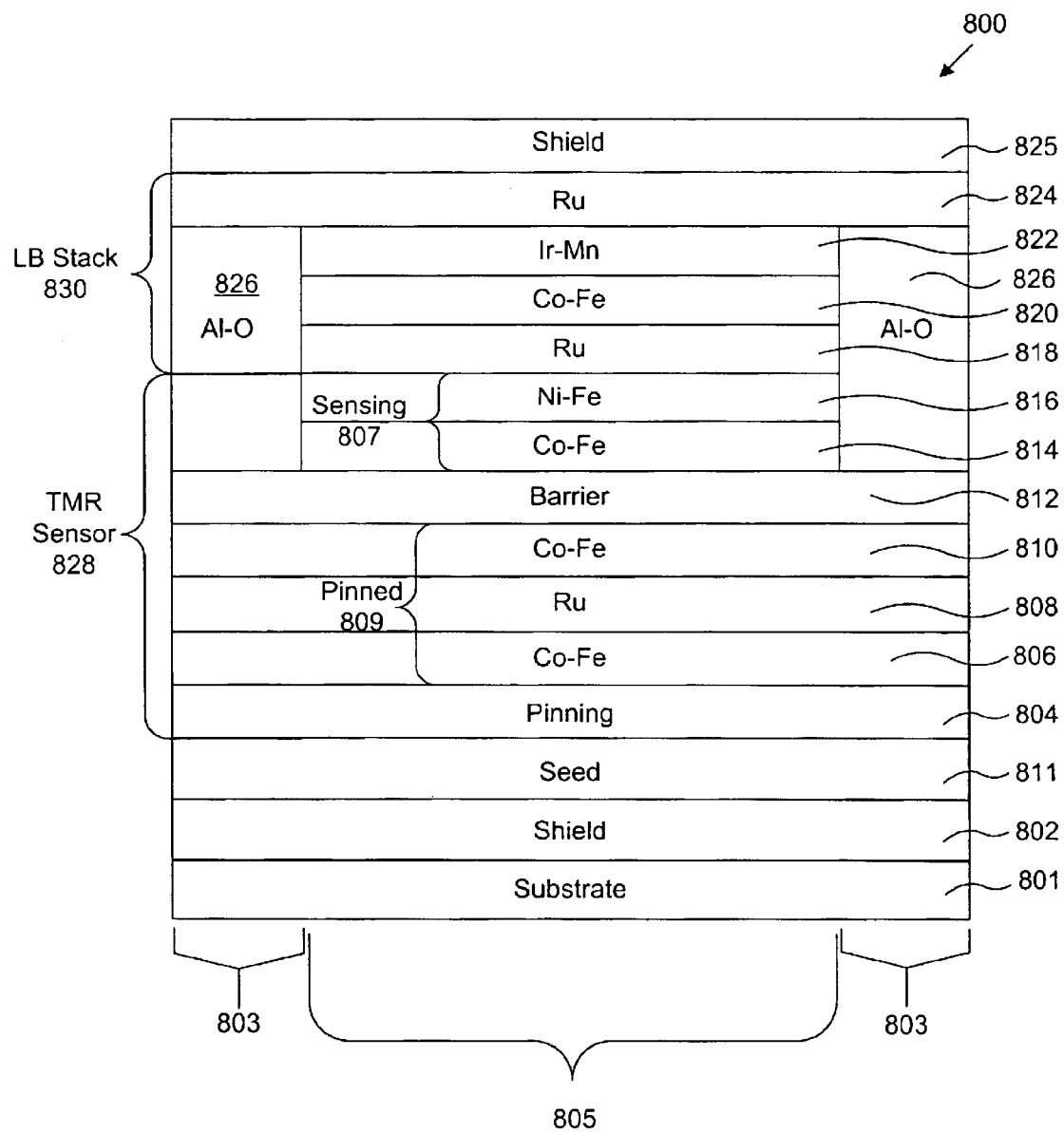
FIG. 8 is a cross-sectional view illustrating the structure of TMR head in accordance with one embodiment of the present invention.

Referring to FIG. 8, shown therein is a TMR head 800 comprising a TMR sensor 828 and a longitudinal bias (LB) stack 830 in a central region 801. FIG. 8 shows the lower portion of the TMR sensor and an insulating gap layer 826 in each of a pair of end regions 803. The TMR sensor 828, the longitudinal bias (LB) stack 830, and the gap layer 826 are formed by a suitable method such as DC-magnetron or ion-beam sputter-deposition on a wafer 802.

In the TMR sensor 828, ferromagnetic sensing layers 807 are separated from ferromagnetic transverse pinned layers 809 by a 6 Å thick, in-situ oxidized, Al (Al—O) barrier layer 812. Under one embodiment of the present invention, the sensing layers 807 comprise a 9 Å thick Co—Fe film 814 and an adjacent 27 Å thick Ni—Fe film 816. The transverse pinned layers 809 comprise an 18 Å thick Co—Fe film 806, an 8 Å thick Ru film 808 and a 24 Å thick Co—Fe layer film 810. The magnetizations of the transverse pinned layer 809 are fixed through exchange coupling with a 200 Å thick antiferromagnetic Pt—Mn transverse pinning layer 804 in a transverse directional perpendicular to an air bearing surface (ABS).

In the LB stack 830, a ferromagnetic 30 Å thick Co—Fe longitudinal pinned layer 820 is separated from the ferromagnetic Co—Fe/Ni—Fe sense layers 807 by a 30 Å thick nonmagnetic Ru decoupling layer 818, and is overlaid with a 60 Å thick antiferromagnetic Ir—Mn longitudinal pinning layer 822 and a nonmagnetic 90 Å thick Ru cap layer 824. The magnetization of the longitudinal pinned layer 820 are fixed through exchange coupling with the antiferromagnetic Ir—Mn longitudinal pinning layer 804 in a longitudinal directional parallel to the ABS.

In one embodiment of a manner of forming the TMR head 800, a bottom shield layer 802, preferably formed of a 1 μm thick Ni—Fe film, and a seed layer 811, preferably formed of a 90 Å thick Ta film are deposited on a wafer 801. An antiferromagnetic pinning layer 804, preferably formed of a 200 Å thick Pt—Mn film is deposited on the seed layers 811.

The pinned layers 809 are deposited on the pinning layer 804 and a barrier layer 812, preferably formed of an in-situ oxidized 6 Å thick Al (Al—O) film is deposited on the pinned layers 809. The sensing layers 807 are deposited on the barrier layer 812.

The LB stack, preferably formed of a 30 Å thick Ru film, a 40 Å thick Co—Fe film, a 60 Å thick Ir—Mn film, a 90 Å thick Ru film, and a 30 Å thick Ta film are then deposited on the sensing layer 807. All the depositions are preferably conducted with DC magnetron sputtering.

The LB stack in the central region plays a crucial role in achieving sensor stability, attaining high signal sensitivity, attaining high read efficiency, and eliminating side reading. The sensor stability can be easily achieved due to magnetostatic interactions between magnetic moments of the sense and the longitudinal pinned layers, which form a flux closure after the TMR sensor 828 overlaid with the LB stack 830 is ion-milled for the definition of the sensor width. The high signal sensitivity can be attained since the magnetic moment of the longitudinal pinned layer is only needed to be 1.5 times of the magnetic moments of the sense layers for sensor stability, instead of more than 6 times when Cr/Co—Pt—Cr films are used in the first embodiment. The high read efficiency can be attained since stray fields stemming from the Co—Pt—Cr film used in the first embodiment do not exist at sensor edges. As a result, stray-field induced sensor stiffness at sensor edges is substantially reduced. Side reading can be eliminated since the TMR sensor and the LB stack are self-aligned in the fabrication process. As a result, a precise read width control can be achieved.

After the depositions, the wafer is annealed for 300 minutes at 265° C. in a magnetic field of 10 kOe perpendicular to an alignment mark, and then annealed again for 20 minutes at 240° C. in a magnetic field of 200 Oe parallel to the alignment mark. These two anneals After the depositions, the wafer is annealed for 300 min at 265° C. in a magnetic cause the Pt—Mn film to pin the magnetizations of the Co—Fe/Ru/Co—Fe films in a direction perpendicular to the alignment mark, and cause the Ir—Mn film to pin the magnetization of its underlying Co—Fe film in a direction parallel to the alignment mark. After these two anneals, bilayer photoresists are applied and exposed in a photolithographic tool to mask the magnetic-tunnel-junction sensor TMR sensor 828 and the LB stack 830 in a read the central region, and then developed in a solvent to form an undercut.

Unmasked TMR sensor 828 and the LB stack 830 in unmasked end regions 803, 805 of the GMR head 800 are removed by ion milling until the Al—O barrier layer is exposed. Subsequently, a gap region 826 is formed by depositing a plurality of layers, preferably formed of in-situ oxidized Al (Al—O), on the exposed Al—O film. In one embodiment, 22 layers are formed. The repeated deposition/in-situ oxidization process is preferably identical to that described above for FIG. 7. After this repeated deposition/in-situ oxidization process, the bilayer photoresist mask is lifted off, and a further patterning process is applied to the wafer for opening the central region. Ion milling or reactive ion etching is applied to remove the 30 Å thick Ta film and a top shield layer 825, preferably formed of a 1 μm thick Ni—Fe film, is deposited in the central region.

It should be noted that a partial in-situ oxidation is preferred for the formation of the cap layer of the spin-valve sensor, an optimal in-situ oxidation is preferred for the formation of the barrier layer of the magnetic-tunnel-junction sensor, and a full in-situ oxidation is preferred for the formation of the gap layers of the GMR head 700 and the TMR head 800. The partial in-situ oxidation may be attained after deposition of a 8 Å thick Al film and in-situ oxidation for 8 minutes in an oxygen gas of 0.5 Torr. The optimal in-situ oxidation may be attained after deposition of a 5.6 Å thick Al film and in-situ oxidation for 4 minutes in an oxygen gas of 2 Torr. Likewise, the full in-situ oxidation may be attained after deposition of a 8 Å thick Al film and in-situ oxidation for 16 minutes in an oxygen gas of 2 Torr.

In conducting the in-situ oxidization operations of the above embodiments, the Al films are preferred to be as thin as possible. A thicker Al film may be used and may be exposed to air for full ex-situ oxidization, but this full ex-situ oxidization is less preferred, as it may cause air contamination.

To determine suitable oxygen pressures and in-situ oxidization time needed for the full in-situ oxidization, the in-situ oxidation process is preferably monitored by in-situ probing. In so doing, $Al_2O_3(30)/Ni$—Fe(20) and $Al_2O_3(30)/Ni$—Fe(20)/Al(10) films are deposited on a glass substrate in DC magnetron sputtering modules, and are in-situ probed either during staying in a vacuum of $4 \times 10^{-8}$ Torr or during in-situ oxidization in an oxygen gas of 2 Torr in an oxidation module, and then capped with a 60 Å thick Ta film.

Figure 9:
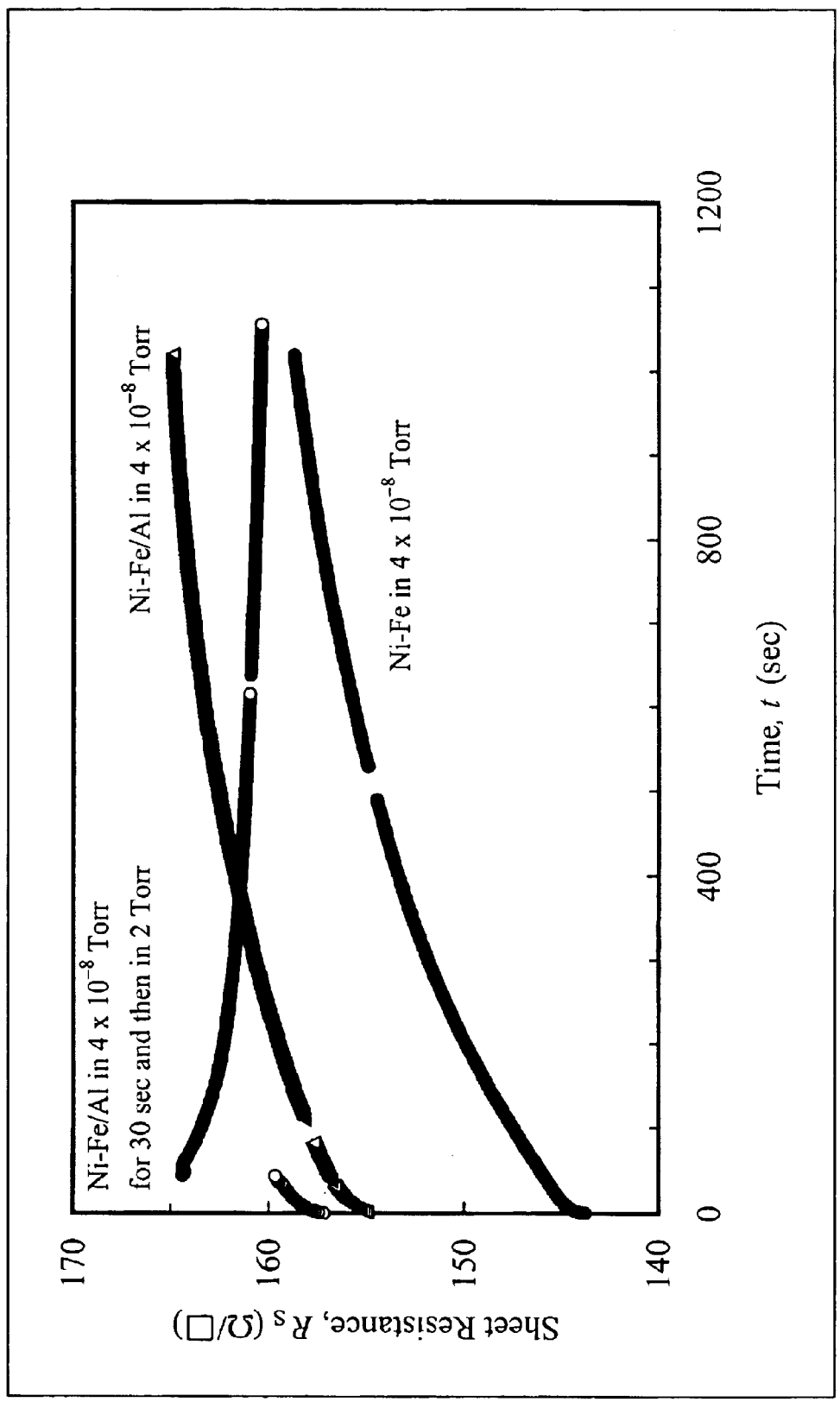
FIG. 9 is a chart showing the sheet resistance ($R_s$) versus the in-situ oxidization time (t) for $Al_2O_3$/Ni—Fe and $Al_2O_3$/Ni—Fe/Al films.

FIG. 9 shows the sheet resistance ($R_s$) attained under the present invention versus the in-situ oxidization time (t). Initial probing reveals that the $Al_2O_3/Ni$—Fe/Al films exhibit an $R_s$ higher than the $Al_2O_3/Ni$—Fe films. This probing result is somewhat surprising, since both the low electrical resistivity of the Al film (6.0 μΩ-cm), which is much lower than of the Ni—Fe film (23.5 μΩ-cm), and an increase in the total film thickness should theoretically only cause a substantial decrease in $R_s$. However, it is believed by the inventors that atomic mixing at the interface between the Ni—Fe and Al films may occur, and thus cause a more substantial increase in $R_s$. Subsequent probing in the vacuum of $4 \times 10^{-8}$ Torr reveals continuing increases in $R_s$ for both the $Al_2O_3/Ni$—Fe and $Al_2O_3/Ni$—Fe/Al films. In-situ oxidation may thus gradually occur even in a vacuum where some oxygen gases still exist.

The $Al_2O_3/Ni$—Fe/Al films are also preferably in-situ probed in the vacuum of $4 \times 10^{-8}$ Torr for the first 30 seconds, and then in an oxygen gas of 2 Torr. The $R_s$ substantially increases to a maximum value as soon as the oxygen gas is introduced, and then begins to decrease. This probing result is also somewhat surprising, since oxygen penetration during continuing in-situ oxidization should only cause an increase in $R_s$. It is believed by the inventors that this decrease in $R_s$ indicates full in-situ oxidization, as described below. After introducing the oxygen gas, the Al film becomes immediately oxidized, and when the Al atoms at the interface between the Ni—Fe and Al films interface become oxidized, a sharp interface between the Ni—Fe and Al—O films may be created. As a result, specular electron scattering may occur in the Ni—Fe film confined by the $Al_2O_3$ and Al—O films, leading to the decrease in $R_s$.

To determine suitable oxygen pressures and in-situ oxidization time needed for the full in-situ oxidization, in addition to the $R_s$, the magnetic moment of the underlying Ni—Fe film may also be monitored. The $Al_2O_3/Ni$—Fe/Al—O/Ta films are preferably annealed for 300 minutes at 265° C. in a direction parallel to the easy axis of the Ni—Fe film, and magnetic properties of the Ni—Fe film are measured with a high-sensitivity vibrating sample magnetometer. If the desired full in-situ oxidization is not attained yet, residual Al atoms in contact with the Ni—Fe film may diffuse into the Ni—Fe film during annealing, causing a loss in the magnetic moment of the Ni—Fe film from 0.16 memu/cm² (equivalent to 20 Å in Ni—Fe magnetic thickness) to 0.12 memu/cm² (equivalent to 15 Å in Ni—Fe magnetic thickness). If the desired full in-situ oxidization is attained, the Al—O film in contact with the Ni—Fe film protects the Ni—Fe film from oxygen penetration, thus maintaining the entire magnetic moment of the Ni—Fe film at 0.16 memu/cm² (equivalent to 20 Å in Ni—Fe magnetic thickness).

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A spin-valve sensor disposed between gap layers, comprising:

an antiferromagnetic pinning layer;

a pinned layer disposed to one side of the antiferromagnetic pinning layer;

a sensing layer;

a spacer layer disposed between the pinned layer and the sensing layer; and a gap layer disposed to one side of the antiferromagnetic pinning layer, the gap layer comprising a plurality of in-situ oxidized metallic films, formed from fully oxidized pure metallic films.

2. Th spin-valve sensor of claim 1, wherein the gap layer comprises a first gap layer dispose to one side of the antiferromagnetic pinning layer and further comprising a second gap layer disposed to one side of the sensing layer; the first and second gap layers comprising a plurality of in-situ oxidized metallic films.

3. The spin-valve sensor of claim 2, wherein the plurality of in-situ oxidized metallic films has a cumulative thickness in a range of between about 50 Å and about 200 Å.

4. The spin-valve sensor of claim 2, wherein the plurality of in-situ oxidized metallic films has a cumulative thickness in a range of between about 75 Å and about 150 Å.

5. The spin-valve sensor of claim 2, wherein each of the plurality of films has a cumulative thickness of about 100 Å.

6. The spin-valve sensor of claim 1, further comprising a plurality of seed layers disposed to one side of the antiferromagnetic pinning layer; the seed layers comprising an $Al_2O_3$ film, a Ni—Cr—Fe film and a Ni—Fe film; the antiferromagnetic pinning layer formed of a Pt—Mn film; the pinned layers formed of a Co—Fe film, Ru film, and a Co—Fe film; the spacer layer formed of an oxygen-doped, in-situ oxidized Cu film; the sensing layer formed of a Co—Fe film and a Ni—Fe film, and a cap layer formed of an in-situ oxidized metallic film.

7. The spin-valve sensor of claim 6, further comprising a partially oxidized cap layer adjacent to the sensing layer.

8. The spin-valve sensor of claim 1, wherein each in-situ oxidized metallic film is formed by sputter-depositing a pure metal in a vacuum and subsequently introducing oxygen to the pure metal film to fully oxidize the metal film.

9. The spin-valve sensor of claim 1, wherein each in-situ oxidized metallic film is sputter-deposited to a thickness of up to about ten Angstroms.

10. The spin-valve sensor of claim 1, wherein each in-situ oxidized metallic film is formed such that contaminants are substantially eliminated from the metallic film.

11. A disk drive system comprising:
a magnetic recording disk;
spin-valve sensor for reading data recorded on the magnetic recording disk, the spin-valve sensor comprising:
an antiferromagnetic pinning layer;
pinned layers formed disposed to one side of the antiferromagnetic pinning layer, the magnetizations of the pinned layers substantially fixed by the antiferromagnetic pinning layer;
a sensing layer formed of ferromagnetic films adjacent to the pinned layers, the sensing layers configured to have an electrical resistance that changes in response to changes in magnetic flux through the sensing layer;
a cap layer disposed to one side of the sensing layers, the cap layer formed of a partially in-situ oxidized metallic film having a thickness in a range of between about 5 and about 15 Å;
a first gap layer disposed to one side of the antiferromagnetic pinning layer, the first gap layer comprising a plurality of oxidized metallic films;
a second gap layer disposed to one side of the cap layer, the second gap layer comprising a plurality of in-situ oxidized metallic films, formed from fully oxidized pure metallic films;
an actuator for moving a read/write head comprising the spin-valve sensor across the magnetic recording disk in order for the spin-valve sensor to access different magnetically recorded data on the magnetic recording disk; and
a detector electrically coupled to the spin-valve sensor and configured to detect changes in resistance of the spin-valve sensor caused by rotation of the magnetization of the sensing layers relative to the fixed magnetizations of the pinned layers in response to changing magnetic fields induced by the magnetically recorded data.

12. A method of fabricating a spin-valve sensor, the method comprising:
forming an antiferromagnetic pinning layer;
forming pinned layers to one side of the antiferromagnetic pinning layer;
forming sensing layers;
forming a spacer layer disposed between the pinned layers and the sensing layers;
forming a cap layer disposed to one side of the sensing layers and a gap layer disposed to one side of the antiferromagnetic pinning layer, the gap layer comprising a plurality of in-situ oxidized metallic films, formed from fully oxidized pure metallic films.

13. The method of claim 12, further comprising forming first and second gap layers, the forming first and second gap layers comprising depositing a metallic film and in-situ oxidizing the metallic film.

14. The method of claim 12, further comprising forming first and second gap layers, the forming first and second gap layers comprising forming a plurality of oxidized metallic films.

15. The method of claim 14, wherein forming a plurality of oxidized metallic films comprises forming a plurality of in-situ oxidized aluminum films, each having a thickness in a range of between about 5 and about 15 Å.

16. The method of claim 12, wherein the deposition and in-situ oxidation of the metallic film comprises depositing the metallic film in a vacuum in a deposition module and transferring the metallic film to an oxidation module also in a vacuum and introducing an oxygen gas to the metallic film in the oxidation module in a controlled environment.

17. The method of claim 16, wherein depositing a metallic film comprises depositing an Al film.

18. The method of claim 16, wherein the deposition and in-situ oxidation of the metallic film comprises DC magnetron sputtering and in-situ oxidation for a time in a range of between about 1 and about 100 minutes in an oxygen gas with a pressure in a range of between about 0.1 and about 10 Torr.

19. The method of claim 16, wherein introducing the oxygen gas comprises introducing the oxygen gas with a pressure in a range of between about 0.5 and 5 Torr.

20. The method of claim 16, wherein introducing the oxygen gas comprises introducing the oxygen gas with a pressure in a range of between about 1 Torr and about 3 Torr.

21. The method of claim 16, wherein introducing the oxygen gas comprises introducing the oxygen gas with a pressure of about 2 Torr.

22. The method of claim 16, wherein introducing the oxygen gas comprises introducing the oxygen gas for a period in a range of between about 4 and about 12 minutes.

23. The method of claim 16, wherein introducing the oxygen gas comprises introducing the oxygen gas for a period in a range of between about 6 minutes and about 10 minutes.

24. The method of claim 16, wherein introducing the oxygen gas comprises introducing the oxygen gas for a period of about 8 minutes.

25. The method of claim 16, wherein introducing the oxygen gas is conducted at a temperature of approximately ambient room temperature.

* * * * *

UNITED STATES PATENT AND TRADEMARK OFFICE
CERTIFICATE OF CORRECTION

PATENT NO. : 6,780,524 B2
DATED : August 24, 2004
INVENTOR(S) : Tsann Lin et al.

It is certified that error appears in the above-identified patent and that said Letters Patent is hereby corrected as shown below:

Title page,
Item [57], ABSTRACT,
Line 6, "depositing a metallic films" should read -- depositing metallic films --

Column 6,
Line 9, "is anon-magnetic" should read -- is a non-magnetic --

Column 13,
Line 5, "mark. These two anneals After the" should read -- mark. After the --

Column 14,
Line 62, "2. Th spin-valve" should read -- 2. The spin-valve --

Signed and Sealed this

Eighteenth Day of January, 2005

JON W. DUDAS
*Director of the United States Patent and Trademark Office*